United States Patent
Ogiwara et al.

(10) Patent No.: US 8,531,901 B2
(45) Date of Patent: Sep. 10, 2013

(54) THREE DIMENSIONAL NAND TYPE MEMORY DEVICE HAVING SELECTIVE CHARGE PUMP ACTIVATION TO MINIMIZE NOISE

(75) Inventors: Ryu Ogiwara, Yokohama (JP); Hitoshi Iwai, Kamakura (JP); Kiyotaro Itagaki, Naka-gun (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 218 days.

(21) Appl. No.: 13/196,417

(22) Filed: Aug. 2, 2011

(65) Prior Publication Data

US 2012/0057405 A1    Mar. 8, 2012

(30) Foreign Application Priority Data

Sep. 7, 2010   (JP) ................................. 2010-200040

(51) Int. Cl.
*G11C 7/02*   (2006.01)

(52) U.S. Cl.
USPC .......... 365/206; 365/51; 365/185.17; 365/226

(58) Field of Classification Search
USPC ................... 365/51, 185.11, 185.17, 206, 226
See application file for complete search history.

(56) References Cited

U.S. PATENT DOCUMENTS

| | | | |
|---|---|---|---|
| 7,933,151 B2 * | 4/2011 | Maeda et al. ............. | 365/185.11 |
| 7,936,004 B2 * | 5/2011 | Kito et al. ...................... | 257/324 |
| 8,218,358 B2 * | 7/2012 | Katsumata et al. ........... | 365/161 |
| 8,295,091 B2 * | 10/2012 | Itagaki et al. ............. | 365/185.17 |
| 8,334,551 B2 * | 12/2012 | Itagaki et al. ................. | 257/216 |
| 2010/0207195 A1 | 8/2010 | Fukuzumi et al. | |

FOREIGN PATENT DOCUMENTS

| | | |
|---|---|---|
| JP | 11-317501 | 11/1999 |
| JP | 2004-56140 | 2/2004 |
| JP | 2009-117018 | 5/2009 |
| JP | 2009-117669 | 5/2009 |
| JP | 2009-266946 | 11/2009 |

OTHER PUBLICATIONS

Takashi Maeda, et al., "Multi-stacked 1G cell/layer Pipe-shaped BiCS Flash Memory", 2009 Symposium on VI SI Circuits Digest of Technical Papers, 2009, pp. 22 and 23.

* cited by examiner

*Primary Examiner* — Vanthu Nguyen
(74) *Attorney, Agent, or Firm* — Oblon, Spivak, McClelland, Maier & Neustadt, L.L.P.

(57) ABSTRACT

A semiconductor memory device comprises a cell array, voltage generation circuits, and a control circuit. The cell array comprises memory cell strings. The voltage generation circuits are arranged below the cell array. Each of the memory cell strings comprises a semiconductor layer, control gates, and memory cell transistors. The semiconductor layer comprises a pair of pillar portions, and a connecting portion. The control gates intersect the pillar portion. The memory cell transistors are formed at intersections of the pillar portion and the control gates. In a write operation and a read operation, the control circuit does not drive voltage generation circuits which give noise to memory cell strings as a write target and a read target, and drives voltage generation circuits which do not give noise to the memory cell strings as the write target and the read target.

10 Claims, 15 Drawing Sheets

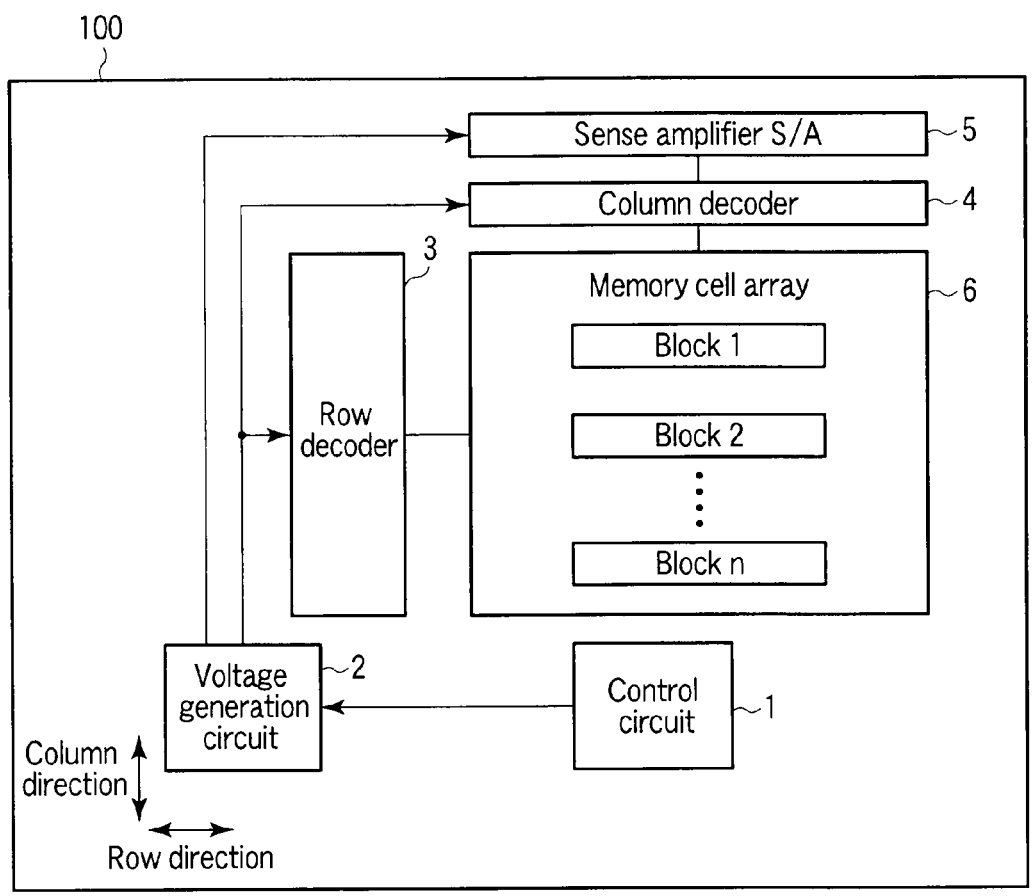
F I G. 1

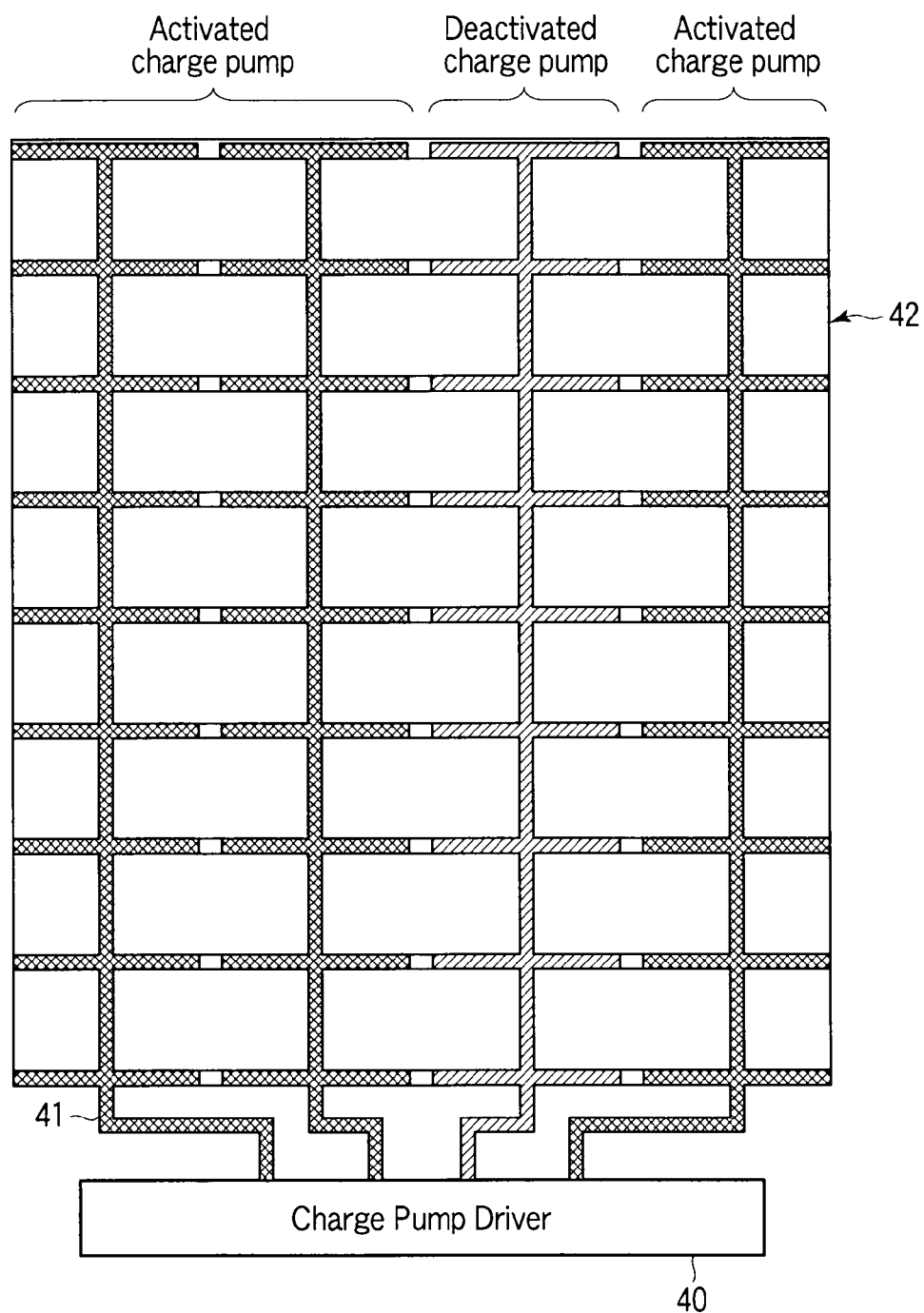
F I G. 4

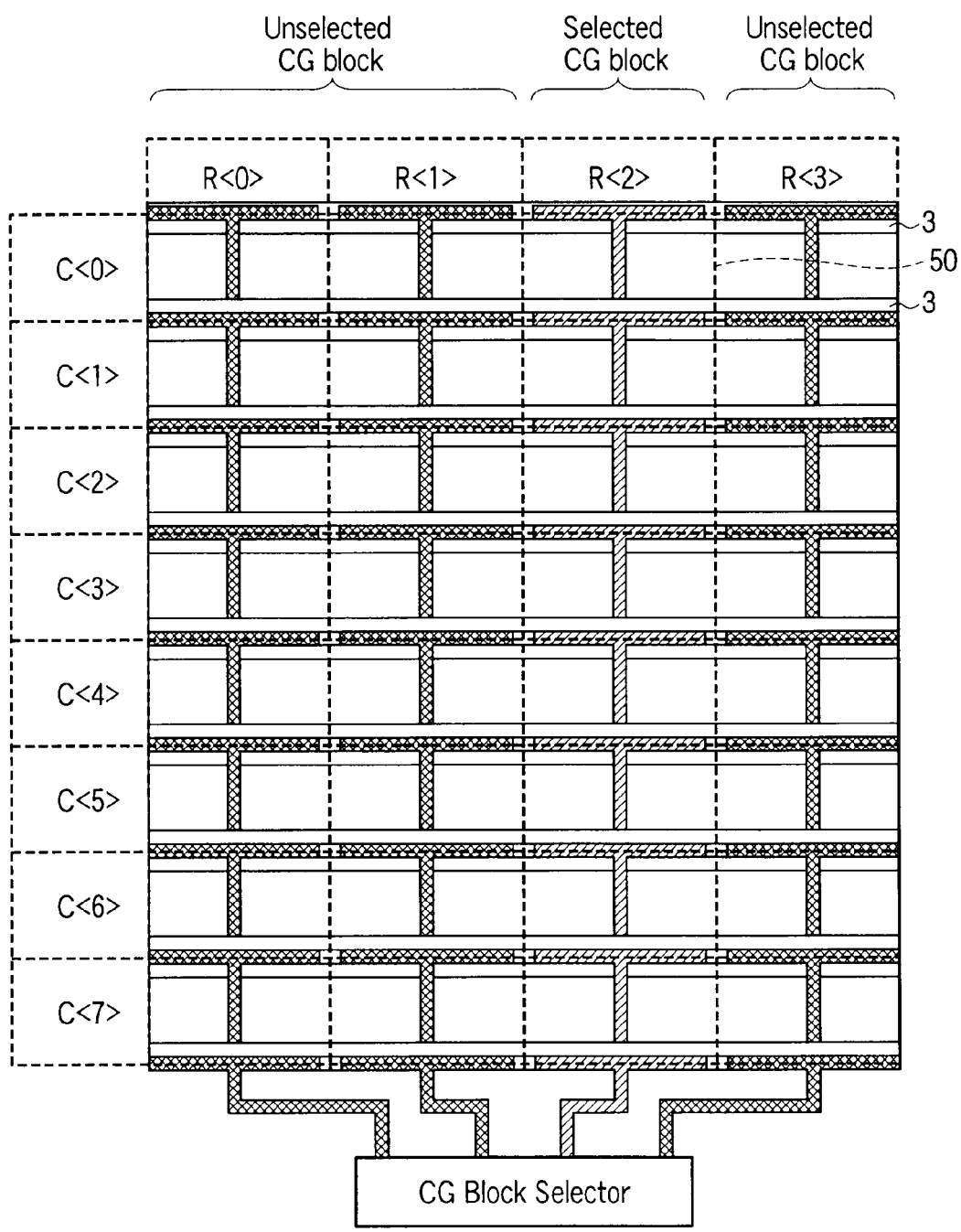
F I G. 6

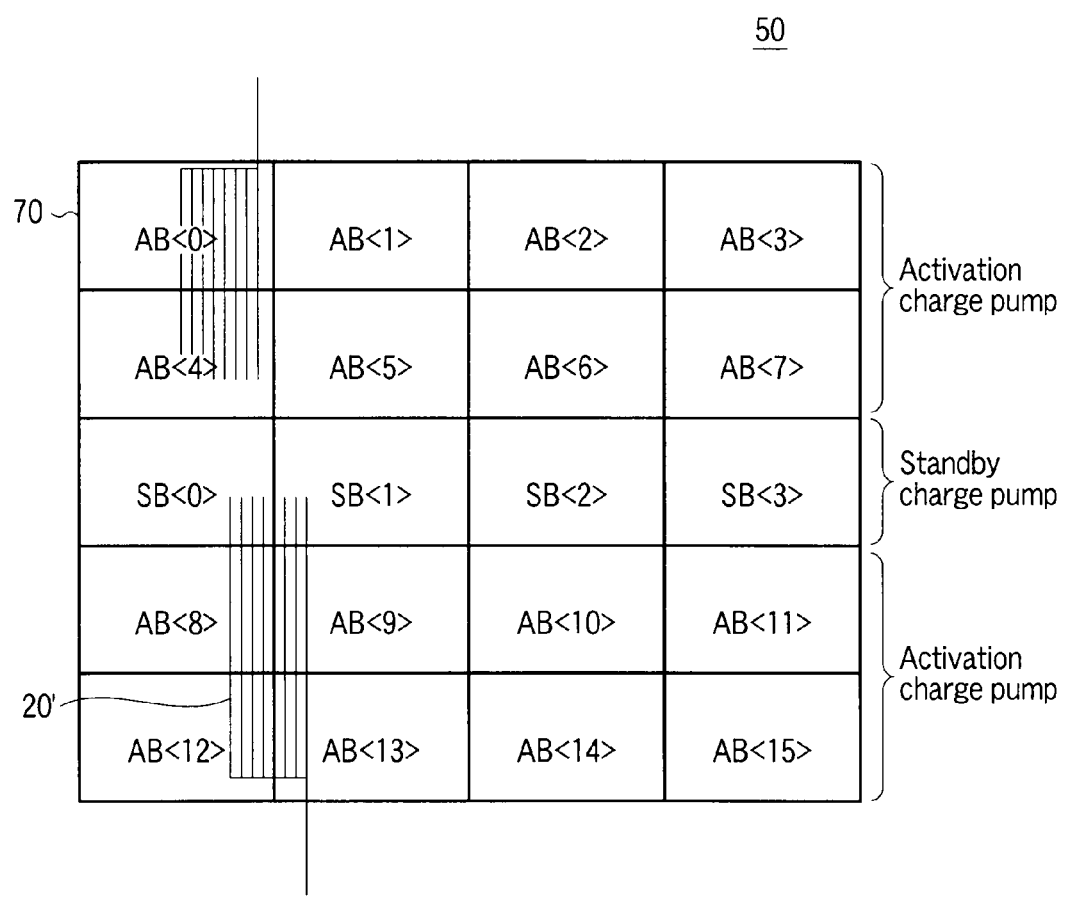
F I G. 7

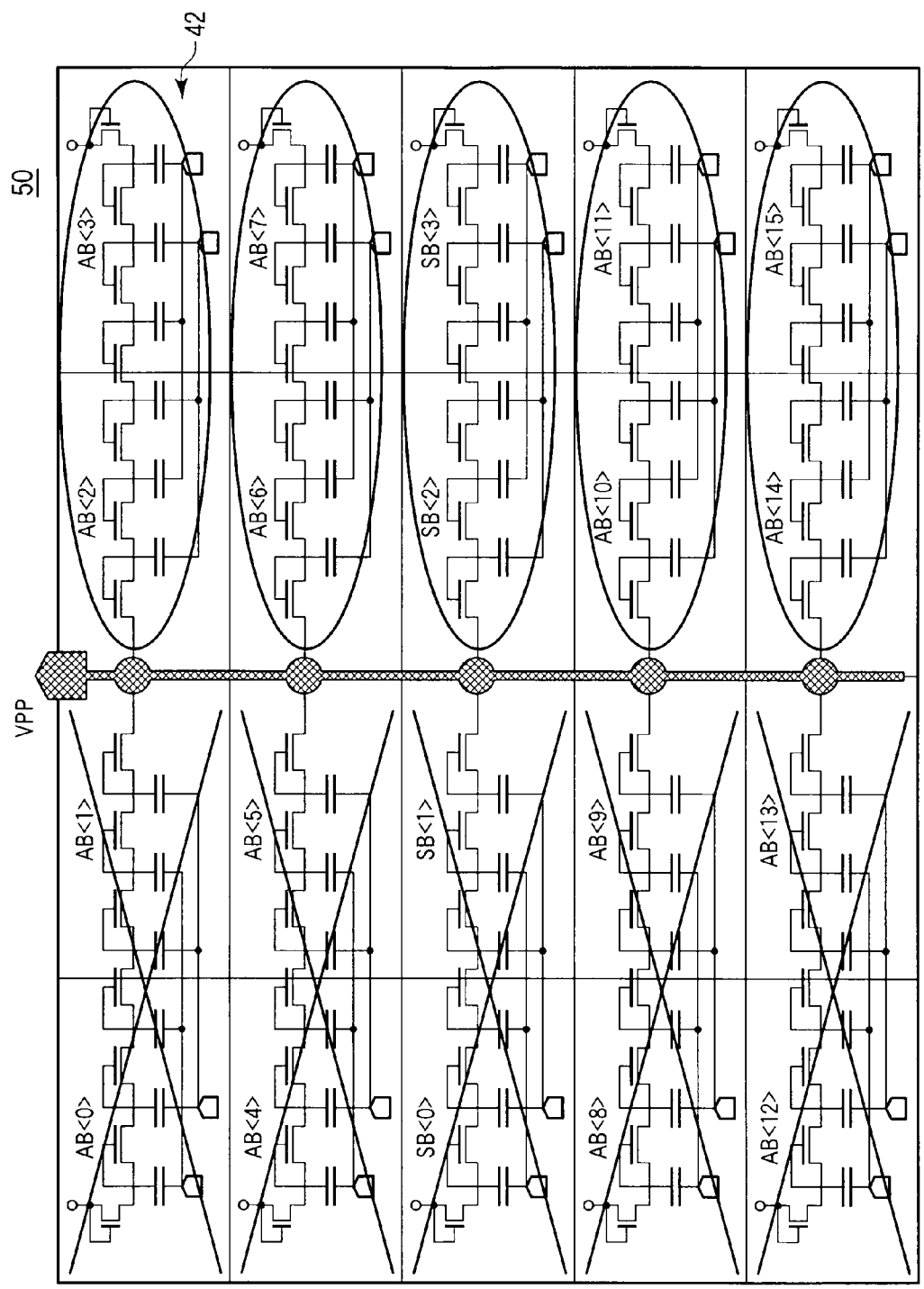
F I G. 10

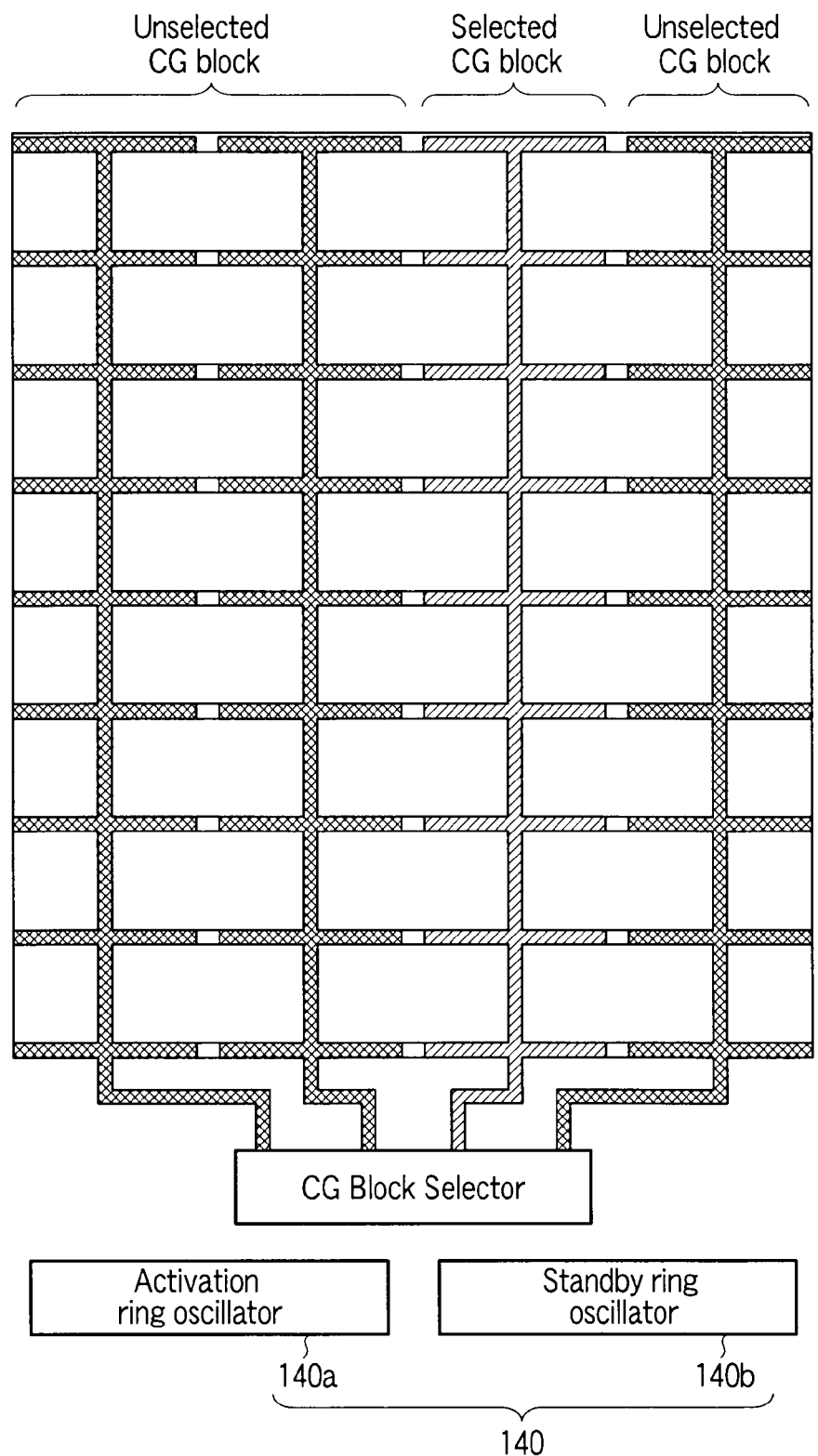
F I G. 15

THREE DIMENSIONAL NAND TYPE MEMORY DEVICE HAVING SELECTIVE CHARGE PUMP ACTIVATION TO MINIMIZE NOISE

CROSS-REFERENCE TO RELATED APPLICATIONS

This application is based upon and claims the benefit of priority from Japanese Patent Application No. 2010-200040, filed Sep. 7, 2010; the entire contents of which are incorporated herein by reference.

FIELD

Embodiments described herein relate generally to a semiconductor memory device.

BACKGROUND

In a conventional LSI, elements are integrated in a two-dimensional plane on a silicon substrate. To increase the storage capacity of a memory, therefore, the dimensions of each element must be decreased (by micropatterning). Recently, however, this micropatterning has become difficult from the viewpoints of cost and technique.

The micropatterning of elements requires improvements in photolithography techniques. In the present ArF immersion exposure technique, rules near 40 nm are the resolution limits, and it is necessary to introduce an EUV (Extreme Ultra Violet) exposure device in order to further advance micropatterning. However, the EUV exposure device requires a very high cost and hence is impractical. Also, even if micropatterning is achieved, the breakdown voltage between elements or the like presumably reaches the physical critical point unless the driving voltage or the like is scaled. This increases the possibility that the operation of the device becomes difficult.

To solve the above problem, a method of three-dimensionally stacking memories has been proposed. However, a general three-dimensional device requires a lithography step to be performed at least three times for each layer, and this lithography step requires a high cost. That is, the three-dimensional memory can increase the storage capacity but cannot reduce the cost. On the contrary, the cost becomes higher than that of a regular two-dimensional memory if four or more layers are stacked.

To solve the cost problem posed by the three-dimensional memory as described above, a BiCS (Bit-Coast Scalable) memory has been proposed. This manufacturing method can collectively form a three-dimensional multilayered memory regardless of the number of layers to be stacked. Therefore, the increase in cost can be suppressed. In the BiCS memory, MONOS transistors are arranged as memory cells at the intersections of gate electrodes and silicon pillars.

As this BiCS memory, a pipe-shaped NAND flash memory in which U-shaped NAND strings are formed in the stacking direction has been proposed. In this pipe-shaped NAND flash memory, two adjacent silicon pillars form one NAND string. More specifically, select gates are formed on the upper ends of the two silicon pillars, one select gate is connected to a bit line, and the other is connected to a source line. Also, the lower ends of the two adjacent silicon pillars are connected by a transistor called a pipe.

To further reduce the area (i.e., to further advance the micropatterning) of the pipe-shaped BiCS memory, a power supply circuit such as a charge pump, a peripheral circuit, a control circuit, and the like can be embedded below a cell array.

In this structure, however, when a data read or write signal passes through the pipe portion formed in the lowermost layer of the cell array, the charge pump in the lower portion is driven and gives noise to the signal. This may cause a write error or read error.

BRIEF DESCRIPTION OF THE DRAWINGS

FIG. 1 is a block diagram showing the overall configuration of a semiconductor memory device according to an embodiment;

FIG. 4 is a plan view schematically showing the operation of a charge pump of the semiconductor memory device according to the first embodiment;

FIG. 6 is a plan view showing the address of each area of the cell array of the semiconductor memory device according to the second embodiment;

FIG. 7 is a plan view showing the address of each block of the cell array of the semiconductor memory device according to the second embodiment;

FIG. 10 is a circuit diagram showing the operation of charge pumps of a semiconductor memory device according to the third embodiment;

FIG. 15 is a plan view schematically showing the operation of ring oscillators of a semiconductor memory device according to the seventh embodiment.

DETAILED DESCRIPTION

Figure 2:
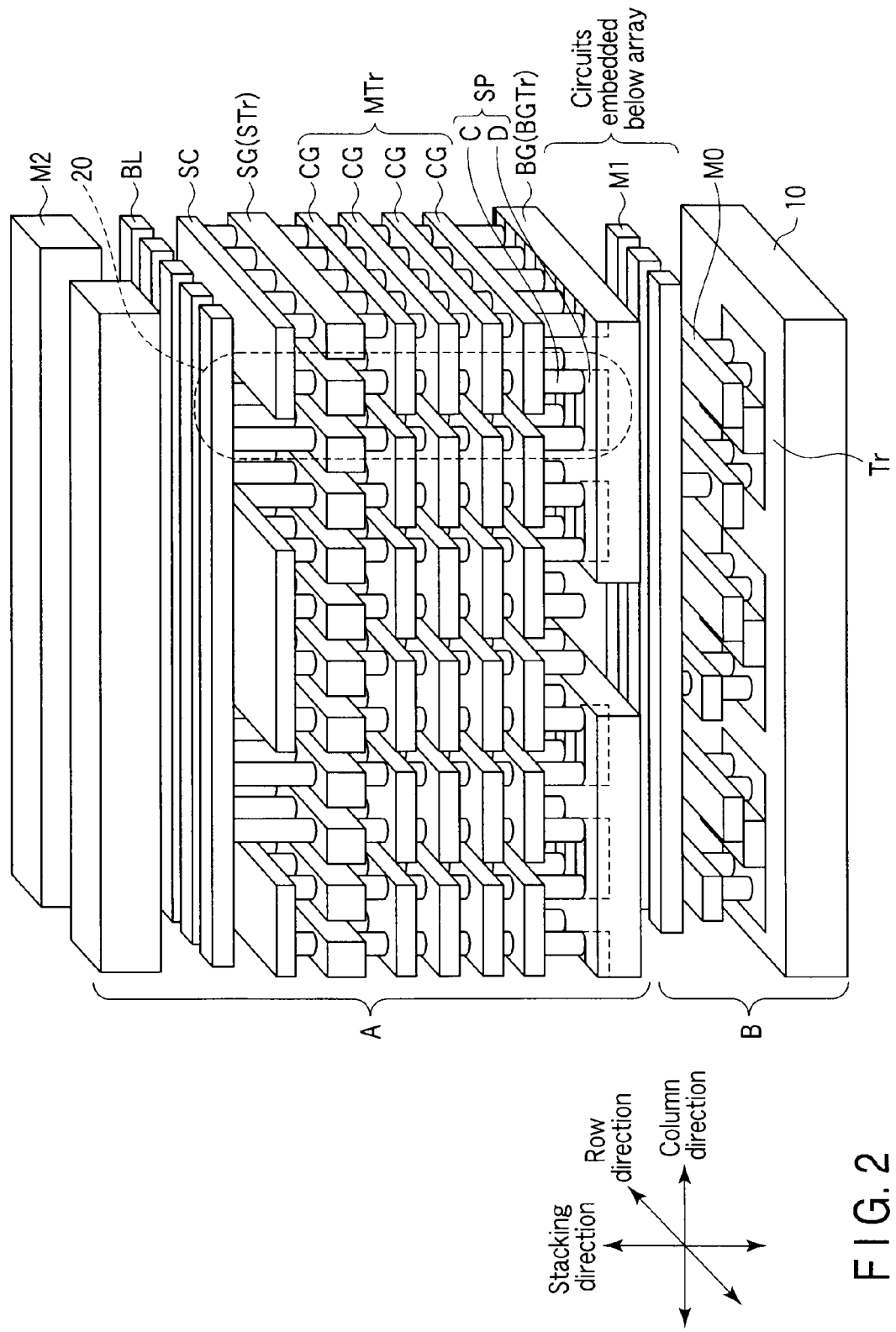
FIG. 2 is a perspective view showing the arrangement of the semiconductor memory device according to the embodiment.

In general, according to one embodiment, a semiconductor memory device comprises a cell array, voltage generation circuits, and a control circuit. The cell array comprises memory cell strings. The voltage generation circuits are arranged below the cell array. Each of the memory cell strings comprises a semiconductor layer, control gates, and memory cell transistors. The semiconductor layer comprises a pair of pillar portions, and a connecting portion. The control gates intersect the pillar portion. The memory cell transistors are formed at intersections of the pillar portion and the control gates. In a write operation and a read operation, the control circuit does not drive voltage generation circuits which give noise to memory cell strings as a write target and a read target, and drives voltage generation circuits which do not give noise to the memory cell strings as the write target and the read target.

Embodiments will be explained below with reference to the accompanying drawing. In the drawing, the same reference numerals denote the same parts.

<Overall Configuration Example>

The overall configuration of a semiconductor memory device (NAND flash memory) according to an embodiment will be explained below with reference to FIG. 1.

FIG. 1 is a block diagram of the semiconductor memory device according to the embodiment.

As shown in FIG. 1, the semiconductor memory device includes a control circuit 1, a voltage generation circuit (e.g., a charge pump) 2, a row decoder 3, a column decoder 4, a sense amplifier S/A 5, and a memory cell array 6.

The control circuit 1 is electrically connected to the voltage generation circuit 2, and controls voltages to be supplied to word lines and bit lines of memory cells in write, read, and erase operations.

The voltage generation circuit 2 is electrically connected to the row decoder 3, column decoder 4, and sense amplifier S/A 5, and generates and supplies voltages necessary for these circuits under the control of the control circuit 1.

The row decoder 3 selects a word line in a write, read, or erase operation, and applies the voltage supplied from the voltage generation circuit 2 to the selected word line.

The column decoder 4 selects a bit line in a write, read, or erase operation, and applies the voltage supplied from the voltage generation circuit 2 to the selected bit line.

The sense amplifier S/A 5 amplifies data read out from a memory cell to a bit line. Note that the sense amplifier S/A 5 may be integrated with the column decoder 4.

The memory cell array 6 includes blocks 1 to n including NAND strings formed perpendicularly to a substrate. In this embodiment, the memory cell array 6 has a three-dimensional multilayered structure.

Note that although not shown in FIG. 1, the voltage generation circuit 2 is formed below the memory cell array 6 in this embodiment.

<Structure>

The structure of the semiconductor memory device according to the embodiment will be explained below with reference to FIG. 2.

FIG. 2 is a perspective view of a BiCS (Bit-Coast Scalable) memory according to the embodiment. Referring to FIG. 2, the row direction is perpendicular to the stacking direction, and the column direction is perpendicular to the stacking direction and row direction.

As shown in FIG. 2, the BiCS memory includes a cell array portion A and circuit portion B.

The cell array portion A includes NAND strings (memory cell strings) 20. Each NAND string 20 includes memory cell transistors MTr and two selection transistors STr.

The memory cell transistors MTr are formed at the intersections of a U-shaped silicon pillar SP and a control gates CG. Each memory cell transistor MTr includes a charge storage layer (not shown) between the U-shaped silicon pillar SP and control gate CG, and has a MONOS structure.

The two selection transistors STr are formed at the intersections of the U-shaped silicon pillar SP and two select gates SG. Both the two selection transistors STr are formed on the upper ends of the U-shaped silicon pillar SP. One selection transistor STr is connected to a source line SC in the upper portion, and the other selection transistor STr is connected to bit lines BL in the upper portion. Interconnection layers M2 are formed on the bit lines BL.

The U-shaped silicon pillar SP has a U-shape when viewed in the row direction. The U-shaped silicon pillar SP includes a pair of pillar portions C extending in the stacking direction, and a pipe portion D formed to connect the lower ends of the pair of pillar portions C. The pipe portion D is formed in a back gate BG, and forms a back gate transistor BGTr.

Also, the U-shaped silicon pillar SP is formed such that a straight line connecting the central axes of the pair of pillar portions C is parallel to the column direction. Furthermore, the U-shaped silicon pillars SP are arranged in a matrix in a plane formed along the row direction and column direction.

The control gates CG are stacked above the back gate BG, and arranged perpendicularly to the pillar portions C of the U-shaped silicon pillar SP. Each control gate CG extends in the row direction. Also, each control gate CG is formed to intersect two adjacent pillar portions C of the U-shaped silicon pillars SP of two NAND strings 20 adjacent to each other in the column direction. Furthermore, the control gates CG are formed to be insulated and isolated from each other in the column direction by a line and space pattern.

The select gates SG are formed above the uppermost control gates CG. Each select gate SG extends in the row direction. Each select gate SG is formed to intersect the pillar portion C of the U-shaped silicon pillar SP. The select gates SG are formed to be insulated and isolated from each other in the column direction by a line and space pattern.

The back gate BG is formed below the lowermost control gates CG. The back gate BG is formed to two-dimensionally spread in the row direction and column direction, so as to cover the lower portions of the pipe portions D of the U-shaped silicon pillars SP.

The source line SC is formed above the select gate SG. The source line SC is formed to intersect two adjacent pillar portions C of the U-shaped silicon pillars SP of two NAND strings 20 adjacent to each other in the column direction. The source line SC extends in the row direction.

The bit lines BL are formed above the source lines SC. The bit lines BL extend in the column direction, and are formed to be insulated and isolated from each other in the row direction by a line and space pattern.

The circuit portion B includes transistors Tr formed on a substrate 10, first interconnection layers M0 formed on the transistors Tr, and second interconnection layers M1 formed on the first interconnection layers M0.

The transistors Tr, the first interconnection layers M0, the second interconnection layers M1 (e.g., aluminum interconnects), capacitors (not shown), and the like form, e.g., a later-described charge pumps 42.

In the embodiment, the circuit portion B (e.g., the charge pumps 42) is formed below the cell array portion A. More specifically, the circuit portion B is formed below the back gates BG in which the pipe portions D are formed. The following problem arises in this structure in which the circuit portion B is formed below the pipe portions D.

Assume that data in the bit line BL is to be written in the memory cell transistor MTr (a memory cell) below the select gate SG on the side of the source line SC via the select gate SG on the side of the bit line BL. In this case, the data signal moves down through the pillar portion C connected to the bit line BL, passes through the pipe portion D formed in the lowermost portion of the cell array portion A, and moves up again through the pillar portion C on the side of the source line SC. After that, the data signal is written in the desired memory cell. That is, when the data signal passes through the pipe portion D, the charge pump 42 formed (immediately) below the pipe portion D mixes noise in the data signal.

On the other hand, even when the desired memory cell as a write target exists on the front side of the pipe portion D when viewed from the bit line BL (i.e., on the side of the pillar portion C connected to the bit line BL), the noise from the charge pump 42 is transmitted to the pillar portion C via the pipe portion D, and mixed in the data signal.

To reduce the resistance, the interconnection layer M1 is formed as the gate of the MOS capacitor of the charge pump 42, and the distance between the interconnection layer M1 and the pipe portion D in the lowermost portion of the cell array portion A is short. Accordingly, the noise of the charge pump 42 is nonnegligibly large. Consequently, the noise of the charge pump 42 formed immediately below the pipe portion D causes a read error and write error of a signal.

By contrast, it is an object of the embodiment to minimize the noise mixed from the charge pump 42 into a data signal of the NAND string 20 via the pipe portion D in the lowermost portion.

First Embodiment

A semiconductor memory device control method according to the first embodiment will be explained below with reference to FIGS. 3 and 4. The first embodiment is an example in which a voltage is supplied by driving a charge pump formed below a cell array in which neither a write operation nor a read operation is performed, without driving a charge pump formed below a cell array in which a write operation or read operation is performed.

Figure 3:
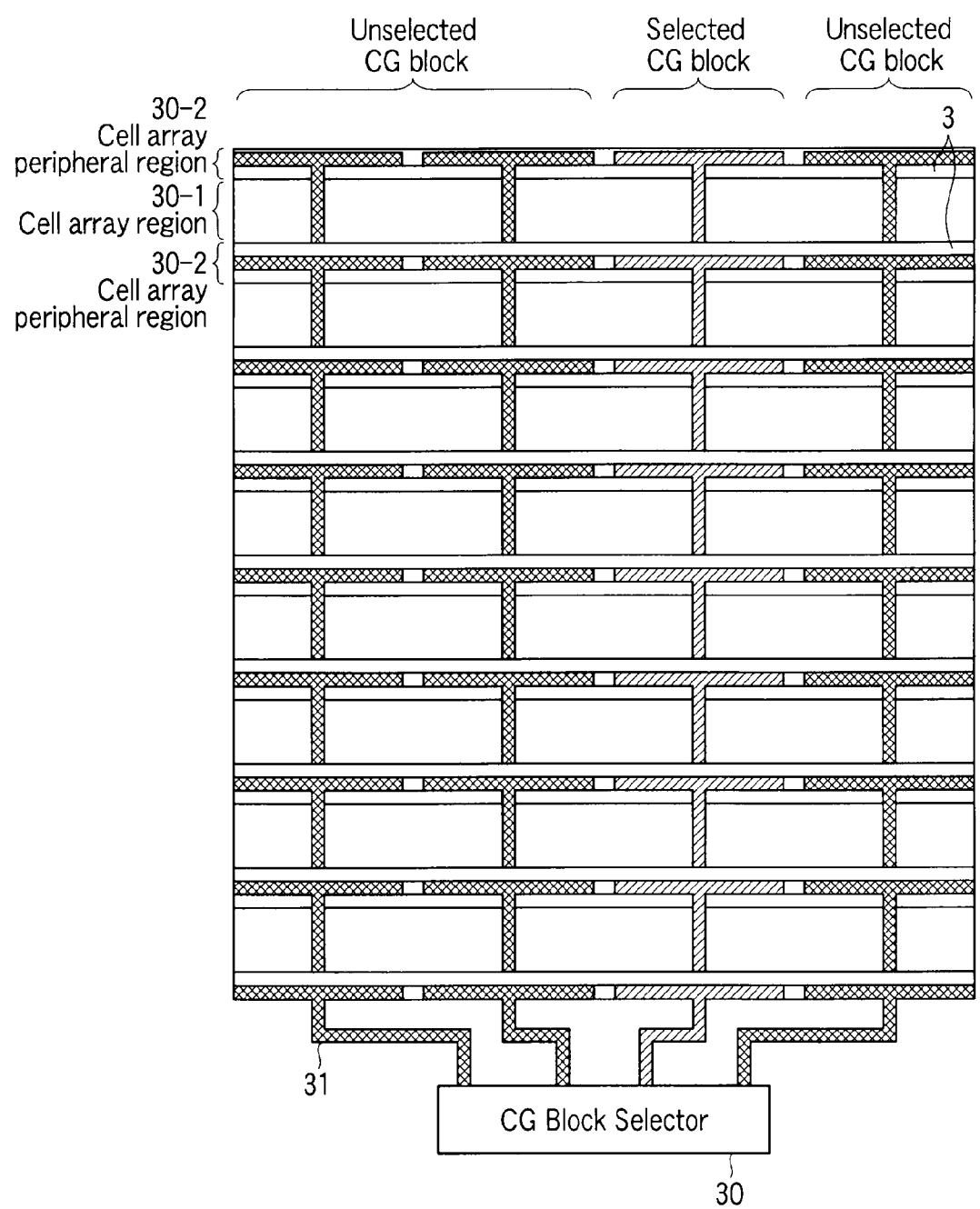
FIG. 3 is a plan view schematically showing a cell array of a semiconductor memory device according to the first embodiment.

FIG. 3 is a schematic plan view of a cell array portion A in one chip of a BiCS memory according to the first embodiment.

As shown in FIG. 3, the cell array portion A in one chip includes control gate blocks (CG blocks). Referring to FIG. 3, one chip includes four CG blocks.

Each CG block includes cell array regions 30-1, and cell array peripheral regions 30-2 formed around the cell array regions 30-1. A NAND string (not shown) is formed in each cell array region 30-1. Also, a row decoder 3 and the like are formed in each cell array peripheral region 30-2.

When performing a write or read operation in one chip, a control gate block selector (CG block selector) 30 selects one of signal lines 31 connected to the CG blocks. This sets a CG block connected to the selected signal line 31 as a selected CG block, and CG blocks connected to other signal lines 31 as unselected CG blocks. That is, the write or read operation is performed in the cell array regions 30-1 of the selected CG block, and neither the write operation nor the read operation is performed in the cell array regions 30-1 of the unselected CG blocks.

FIG. 4 is a schematic plan view of a circuit portion B in one chip of the BiCS memory according to the first embodiment.

As shown in FIG. 4, the circuit portion B in one chip includes regions (in FIG. 4, four regions). As described previously, the circuit portion B is formed below the cell array portion A. That is, the regions shown in FIG. 4 correspond to the CG blocks shown in FIG. 3. Charge pumps 42 are formed as voltage generation circuits in each region of the circuit portion B.

When performing a write or read operation in one chip, a charge pump driver 40 drives (activates) the charge pump 42 in a region corresponding to an unselected CG block in the cell array portion A via a control line 41. That is, the charge pump driver 40 does not drive (deactivates) the charge pumps 42 arranged below a selected CG block, and drives the charge pumps 42 arranged below unselected CG blocks. Accordingly, the charge pumps 42 in the circuit portion B positioned below the unselected CG blocks supply a voltage to the selected CG block in the cell array portion A.

A control circuit 1 shown in FIG. 1 controls the operation described above.

<Effects>

In the above-mentioned first embodiment, the circuit portion B including the charge pumps 42 is formed below the cell array portion A. That is, since the circuit portion B is formed within the range of the projected area of the cell array portion A, the total area of the chip can be reduced.

Also, in this embodiment, the charge pumps 42 formed below a selected CG block (a write or read target) are not driven in a write or read operation. That is, the charge pumps 42 formed below unselected CG blocks (neither write targets nor read targets) supply a voltage to the selected CG block. This makes it possible to reduce noise to be mixed in a data signal for data write or read in the selected CG block. Accordingly, a write or read error can be suppressed.

Second Embodiment

A semiconductor memory device control method according to the second embodiment will be explained below with reference to FIGS. 5, 6, 7, 8, and 9. In the first embodiment, the driving of the charge pumps is controlled by dividing the chip into CG blocks. By contrast, the second embodiment is an example in which the driving of the charge pumps is controlled by further subdividing the CG blocks. Note that in the second embodiment, an explanation of the same features as those of the first embodiment will be omitted, and different features will be explained.

Figure 5:
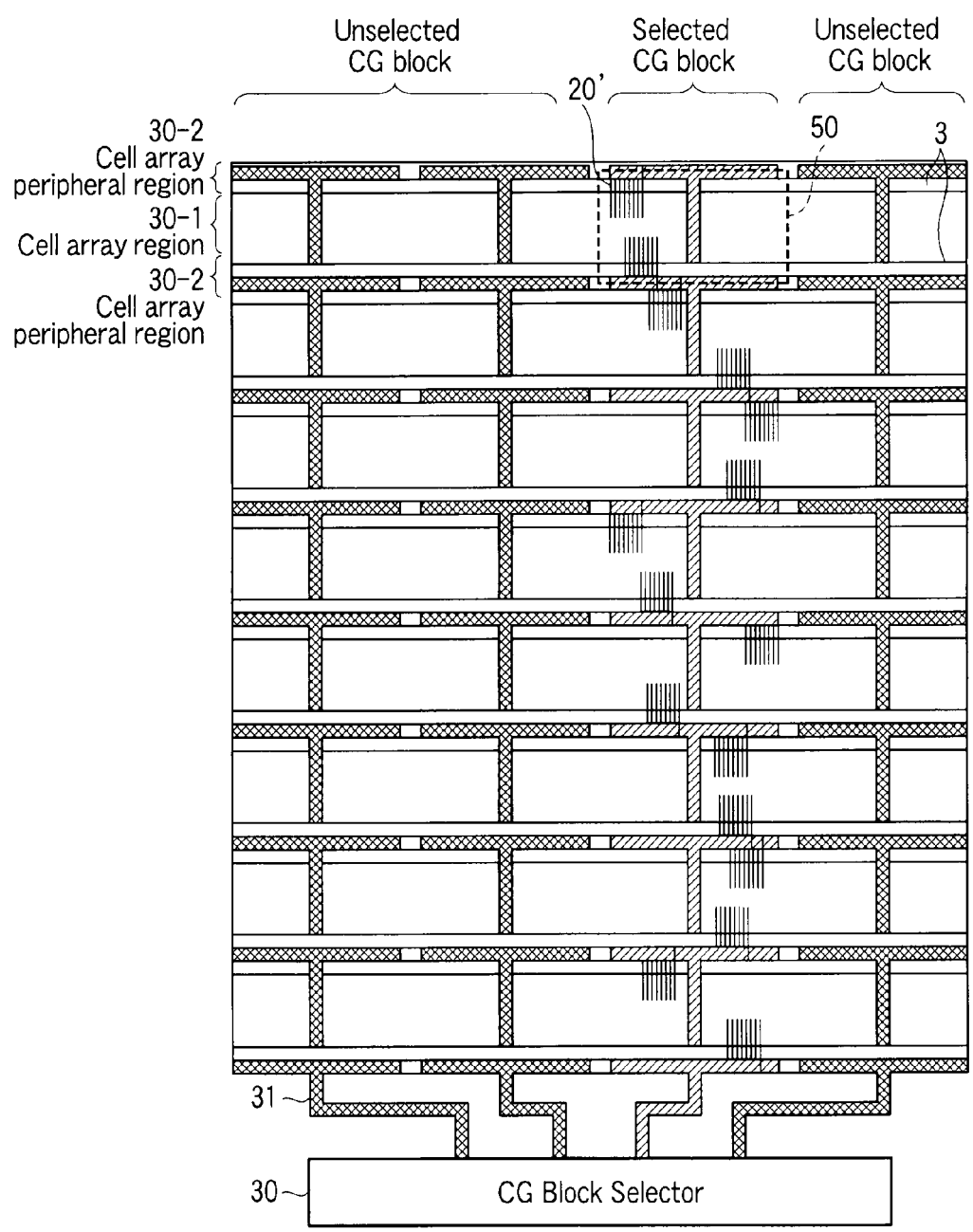
FIG. 5 is a plan view schematically showing a cell array of a semiconductor memory device according to the second embodiment.

FIGS. 5 and 6 are schematic plan views of a cell array portion A in one chip of a BiCS memory according to the second embodiment.

As shown in FIG. 5, a selected CG block is divided into, e.g., eight areas 50. More specifically, as shown in FIG. 6, one chip is subdivided into, e.g., four rows×eight columns, and addresses "R<0> to R<3>, C<0> to C<7>" are allocated to the areas 50. In each area 50, a row decoder 3 or the like selects NAND strings 20 as write or read targets. Although not shown, each area 50 includes a few K (e.g., 22K) NAND strings 20.

In this case, as shown in FIG. 5, every predetermined number of (e.g., eight) NAND strings are selected from the few K NAND strings in one area 50 (the selected NAND strings will be referred to as a NAND string bundle 20' hereinafter). That is, if the driving of all charge pumps 42 below the selected CG block is stopped, the charge pumps 42 below the NAND strings 20 that are actually unselected (that are neither write targets nor read targets) are excessively deactivated. That is, the region of the charge pumps 42 to be deactivated is too large, and this eventually makes it necessary to increase the total area occupied by the charge pumps 42.

In the second embodiment, however, each area 50 is subdivided into blocks each including NAND strings 20, the charge pumps 42 are formed in the individual blocks, and these charge pumps are controlled.

FIG. 7 shows the addresses of individual blocks in one area 50.

As shown in FIG. 7, one area 50 is subdivided into, e.g., twenty blocks 70 each including NAND strings 20. One of addresses "AB<0> to AB<15>" or "SB<0> to SB<3>" is allocated to each block 70. Note that activation charge pumps for driving the blocks 70 at AB<0> to AB<15> in an active state are arranged below the cell array portion A, and standby charge pumps for driving the blocks 70 at SB<0> to SB<3> in a standby state are arranged below the cell array portion A.

Assume that selected NAND string bundles 20' exist in, e.g., the blocks 70 at AB<0>, AB<4>, AB<8>, AB<9>, AB<12>, AB<13>, SB<0>, and SB<1>, as shown in FIG. 7. Note that the NAND string bundles 20' are shown in a plane in each of FIGS. 5 and 7, but they are actually formed backward on the drawing surface.

Figure 8:
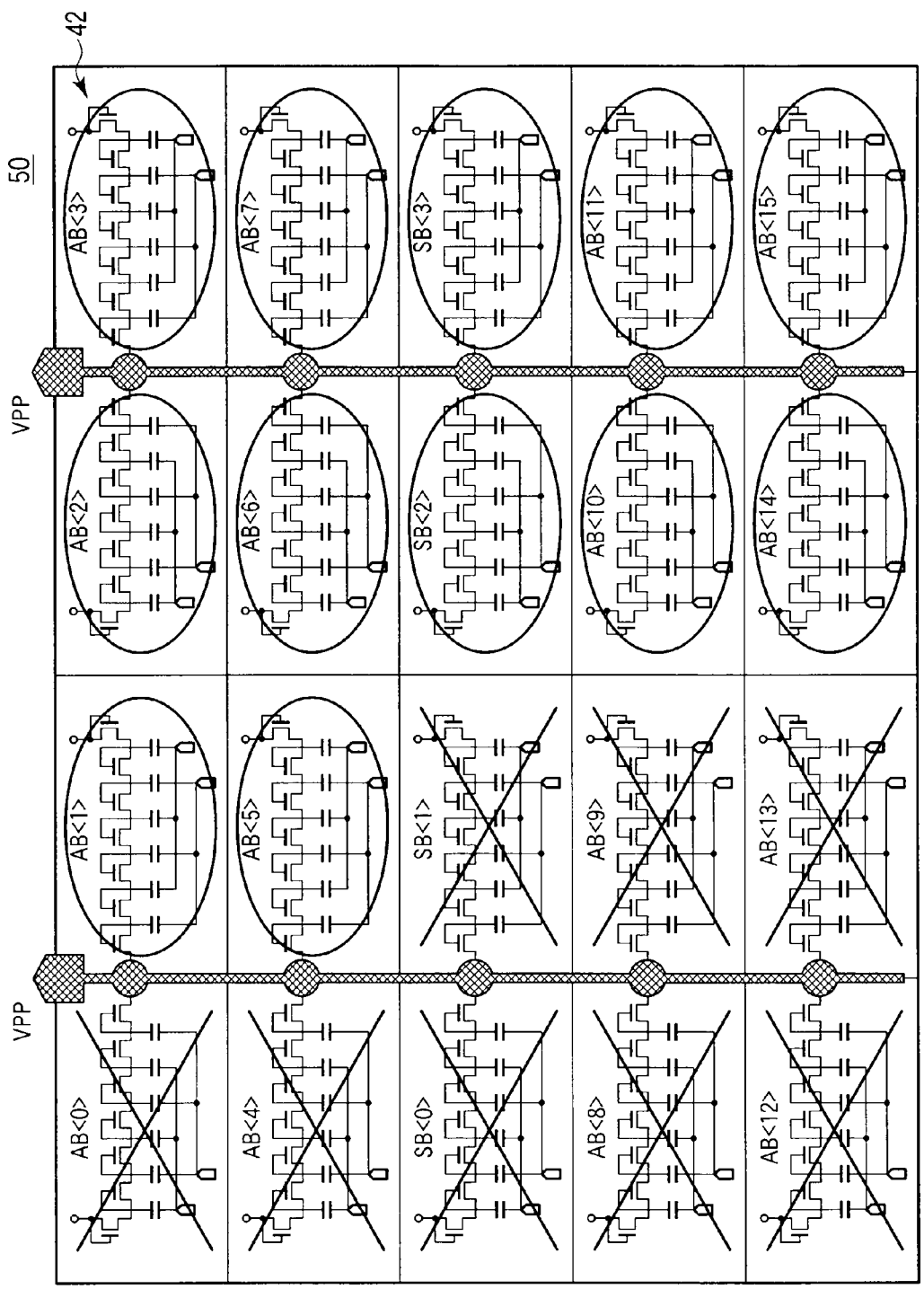
FIG. 8 is a circuit diagram showing the operation of charge pumps of the semiconductor memory device according to the second embodiment.

FIG. 8 is a circuit diagram of the charge pumps 42 arranged below the cell array portion A in one area 50. ○ indicates the block 70 in which no NAND string bundle 20' exists on the charge pump 42, and x indicates the block 70 in which the NAND string bundle 20' exists on the charge pump 42.

In this embodiment as shown in FIG. 8, one charge pump 42 is formed below each block 70. When the selected NAND string bundles 20' exist in the blocks 70 at AB<0>, AB<4>, AB<8>, AB<9>, AB<12>, AB<13>, SB<0>, and SB<1> as shown in FIG. 7, the charge pumps 42 arranged below the blocks 70 at these addresses are not driven, and the charge pumps 42 arranged below other blocks 70 are driven. That is, even when a certain charge pump 42 is positioned below a selected CG block, if the charge pump 42 is positioned below the block 70 in which the NAND string bundle 20' to be actually selected does not exist, the charge pump 42 (in this case, the charge pumps 42 formed below the blocks 70 at AB<1> to AB<3>, AB<5> to AB<7>, AB<10>, AB<11>, AB<14>, AB<15>, SB<2>, and SB<3>) is driven. This minimizes the number of charge pumps 42 not to be driven.

Figure 9:
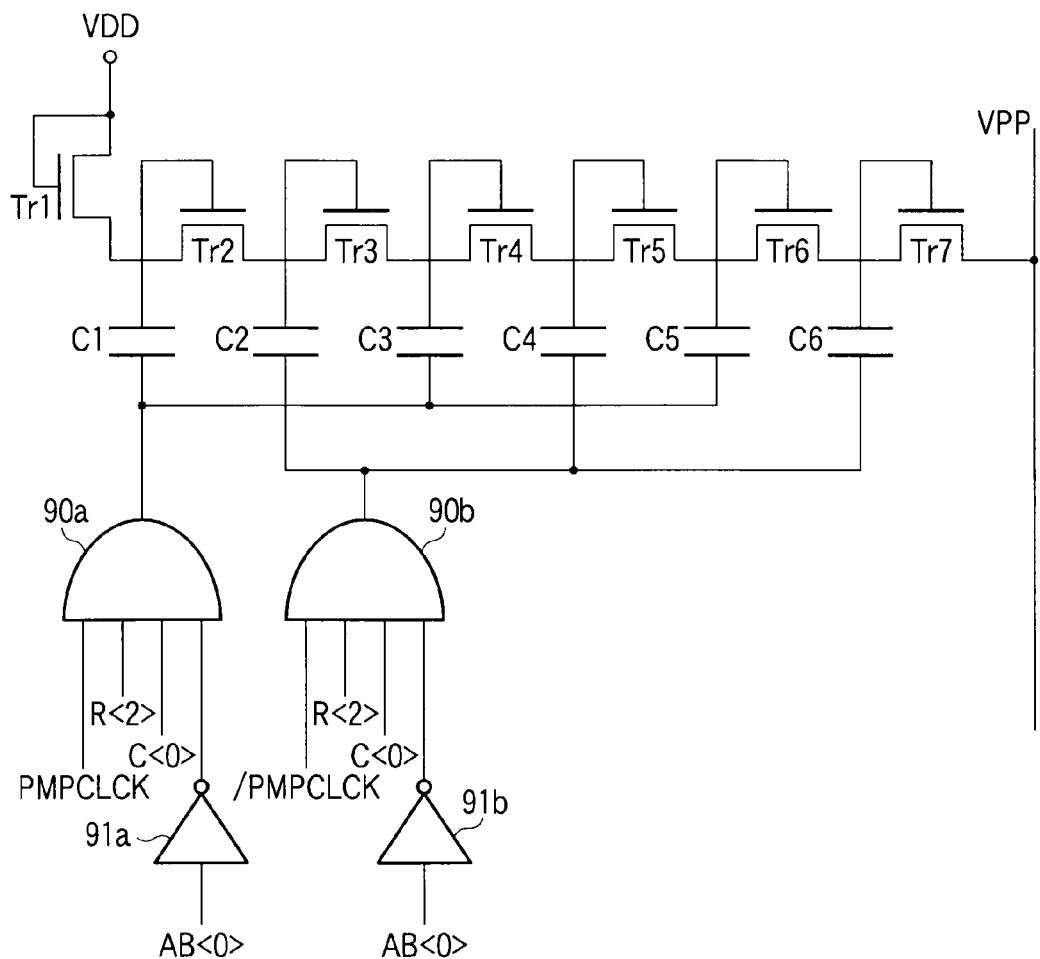
FIG. 9 is a circuit diagram showing the charge pump of the semiconductor memory device according to the second embodiment.

FIG. 9 shows an example of the circuit diagram of the charge pump 42 of this embodiment.

As shown in FIG. 9, the charge pump 42 of this embodiment is, e.g., an NMOS Dickson charge pump. More specifically, in the charge pump 42, diode-connected NMOS transistors (in this example, seven NMOS transistors Tr1 to Tr7) are connected in series between a power supply node and boosted output node. That is, the NMOS transistors are operated as a diode that transfers electric charge in one direction, by connecting the drains and gates of the NMOS transistors together.

Also, one terminal of each of capacitors C1 to C6 is connected to a corresponding one of the connection nodes of the NMOS transistors Tr2 to Tr7, in order to control the potential of the connection node by capacitive coupling. A pump clock PMPCLCK is supplied to the other terminal of each of odd-numbered capacitors C1, C3, and C5, and a pump clock /PMPCLCK is supplied to the other terminal of each of even-numbered capacitors C2, C4, and C6, so that the odd-numbered and even-numbered capacitors are driven by opposite phases. Consequently, a voltage VPP boosted from a power supply voltage VDD can be output to the boosted output node. Note that as shown in FIG. 8, the boosted output nodes of the charge pumps 42 are connected together.

The pump clock signals PMPCLCK and /PMPCLCK are output via logic circuits. FIG. 9 shows logic circuits (AND gates 90a and 90b and inverters 91a and 91b) when driving the charge pump 42 of the block 70 at AB<0> in the area 50 at "R<2>, C<0>".

More specifically, when the area 50 at "R<2>, C<0>" is selected and no NAND string bundle 20' exists in the block 70 at AB<0>, the pump clock signals PMPCLCK and /PMPCLCK are output. That is, when pump clock signals PMP-CLCK and /PMPCLCK="H", R<2> signal="H", C<0> signal="H", and AB<0> signal="L", four-input AND gates 90a and 90b="H", so the pump clock signals PMPCLCK and /PMPCLCK are output. In this case, therefore, the charge pump 42 of the block 70 at AB<0> in the area 50 at "R<2>, C<0>" is driven.

In this embodiment, however, the NAND string bundle 20' exists in the block 70 at AB<0> (FIG. 7). Accordingly, AB<0> signal="H", and four-input AND gates 90a and 90b="L". In this case, therefore, the charge pump 42 of the block 70 at AB<0> in the area 50 at "R<2>, C<0>" is not driven.

<Effects>

The second embodiment described above can achieve the same effects as those of the first embodiment.

In addition, in this embodiment, each CG block is divided into areas 50, each area 50 is subdivided into blocks 70, and the charge pump 42 is formed in each block 70. In a CG block selected in a write or read operation, the charge pump 42 positioned below the block 70 in which an actually selected NAND string bundle 20' exists is not driven. That is, a voltage is supplied to the selected NAND string bundle 20' from not only the charge pumps 42 arranged below unselected CG blocks, but also the charge pumps 42 arranged below the blocks 70 existing in the selected CG block but containing no NAND string bundle 20'. This makes it possible to reduce the number of charge pumps 42 not to be driven. Therefore, a sufficiently high supply voltage can be generated even when the total number of charge pumps 42 is small. Consequently, the total area occupied by the charge pumps 42 can be reduced.

Third Embodiment

A semiconductor memory device control method according to the third embodiment will be explained below with reference to FIGS. 10 and 11. The third embodiment is a modification of the second embodiment, and is an example in which one charge pump is formed for two blocks, and these charge pumps are controlled. Note that in the third embodiment, an explanation of the same features as those of the above-mentioned embodiments will be omitted, and different features will be explained.

FIG. 10 is a circuit diagram of charge pumps 42 arranged below a cell array portion A in one area 50.

In this embodiment as shown in FIG. 10, one charge pump 42 is formed below two adjacent blocks 70. More specifically, one charge pump 42 is formed for each pair of adjacent blocks 70 at AB<0> and AB<1> to adjacent blocks 70 at AB<14> and AB<15>, adjacent blocks SB<0> and SB<1>, and adjacent blocks 70 at SB<2> and SB<3>.

When selected NAND string bundles 20' exist in the blocks 70 at AB<0>, AB<4>, AB<8>, AB<9>, AB<12>, AB<13>, SB<0>, and SB<1> as shown in FIG. 7, the charge pumps 42 positioned below the blocks 70 at these addresses are not driven, and the charge pumps 42 positioned below other blocks 70 are driven. In this case, if the NAND string bundle 20' exists in one of two blocks 70 for which one charge pump 42 is formed, the charge pump 42 is not driven.

Figure 11:
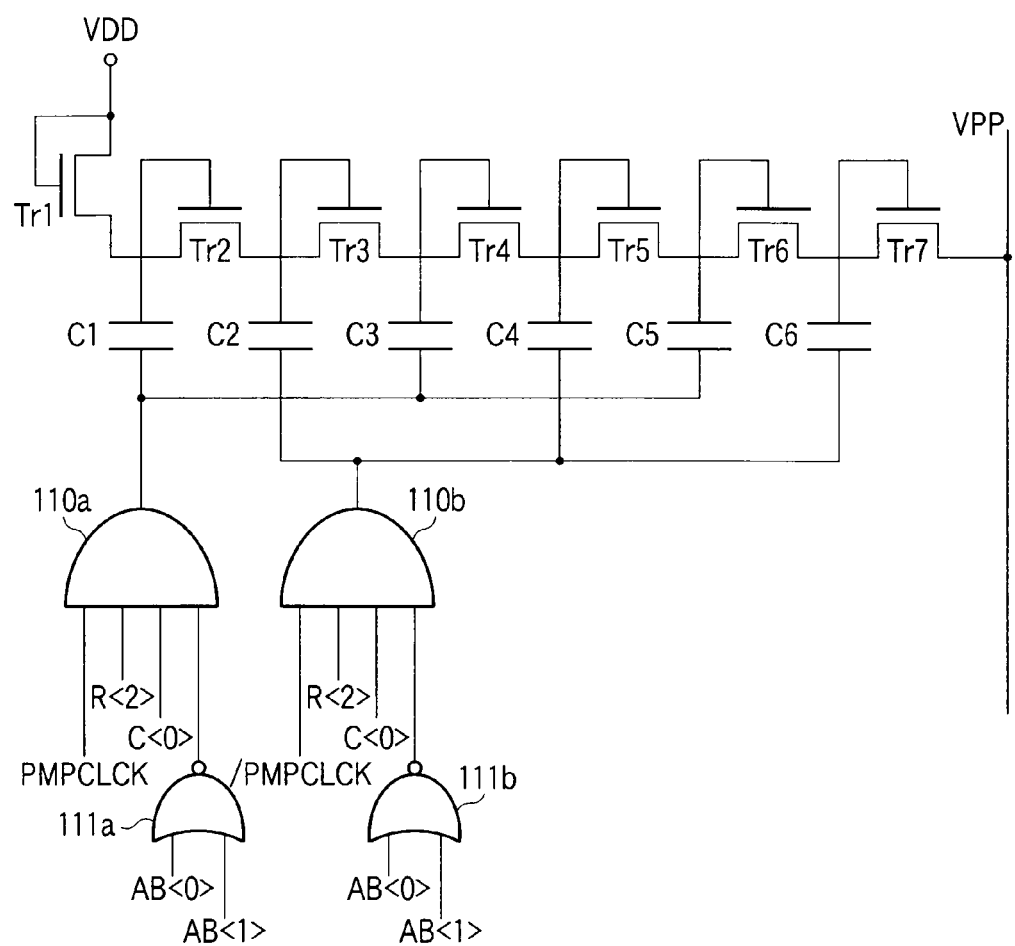
FIG. 11 is a circuit diagram showing the charge pump of the semiconductor memory device according to the third embodiment.

FIG. 11 shows an example of the circuit diagram of the charge pump 42 of this embodiment.

In the charge pump 42 as shown in FIG. 11, diode-connected NMOS transistors (in this example, seven NMOS transistors Tr1 to Tr7) are connected in series between a power supply node and boosted output node. That is, the NMOS transistors are operated as a diode that transfers electric charge in one direction, by connecting the drains and gates of the NMOS transistors together.

Also, one terminal of each of capacitors C1 to C6 is connected to a corresponding one of the connection nodes of the NMOS transistors Tr2 to Tr7, in order to control the potential of the connection node by capacitive coupling. A pump clock PMPCLCK is supplied to the other terminal of each of odd-numbered capacitors C1, C3, and C5, and a pump clock /PMPCLCK is supplied to the other terminal of each of even-numbered capacitors C2, C4, and C6, so that the odd-numbered and even-numbered capacitors are driven by opposite phases. Consequently, a voltage VPP boosted from a power supply voltage VDD can be output to the boosted output node.

The pump clock signals PMPCLCK and /PMPCLCK are output via logic circuits. FIG. 11 shows logic circuits (AND gates 110a and 110b and NOR gates 111a and 111b) when driving the charge pump 42 of the blocks 70 at AB<0> and AB<1> in the area 50 at "R<2>, C<0>".

More specifically, when the area 50 at "R<2>, C<0>" is selected and no NAND string bundle 20' exists in the blocks 70 at AB<0> and AB<1>, the pump clock signals PMPCLCK and /PMPCLCK are output. That is, when AB<0> signal="L" and AB<1> signal="L", two-input NOR gates 111a and 111b="H". In addition, when pump clock signals PMPCLCK and /PMPCLCK="H", R<2> signal="H", and C<0> signal="H", four-input AND gates 110a and 110b="H", so the pump clock signals PMPCLCK and /PMPCLCK are output. Therefore, the charge pump 42 of the blocks 70 at AB<0> and AB<1> in the area 50 at "R<2>, C<0>" is driven.

In this embodiment, however, the NAND string bundle 20' exists in the block 70 at AB<0> (FIG. 7). Accordingly, AB<0> signal="H", and two-input NOR gates 111a and 111b="L". Since four-input AND gates 110a and 110b="L", therefore, the charge pump 42 of the blocks 70 at AB<0> and AB<1> in the area 50 at "R<2>, C<0>" is not driven.

<Effects>

The third embodiment described above can achieve the same effects as those of the second embodiment.

In addition, in this embodiment, one charge pump 42 is formed for two blocks 70. This can make the total number of charge pumps 42 smaller than that of the second embodiment. Consequently, the total area occupied by the charge pumps 42 can be reduced. This embodiment is particularly effective when, e.g., the total area occupied by the charge pump 42 exceeds the projected area of the cell array portion A.

Note that this embodiment is an example in which one charge pump 42 is formed for two blocks 70, but the embodiment is not limited to this. That is, one charge pump 42 can also be formed for three or more blocks 70.

Fourth Embodiment

A semiconductor memory device control method according to the fourth embodiment will be explained below with reference to FIG. 12. The fourth embodiment is a modification of the second embodiment, and is an example in which a standby charge pump positioned below a block in which a selected NAND string bundle exists is driven. Note that in the fourth embodiment, an explanation of the same features as those of the above-mentioned embodiments will be omitted, and different features will be explained.

Figure 12:
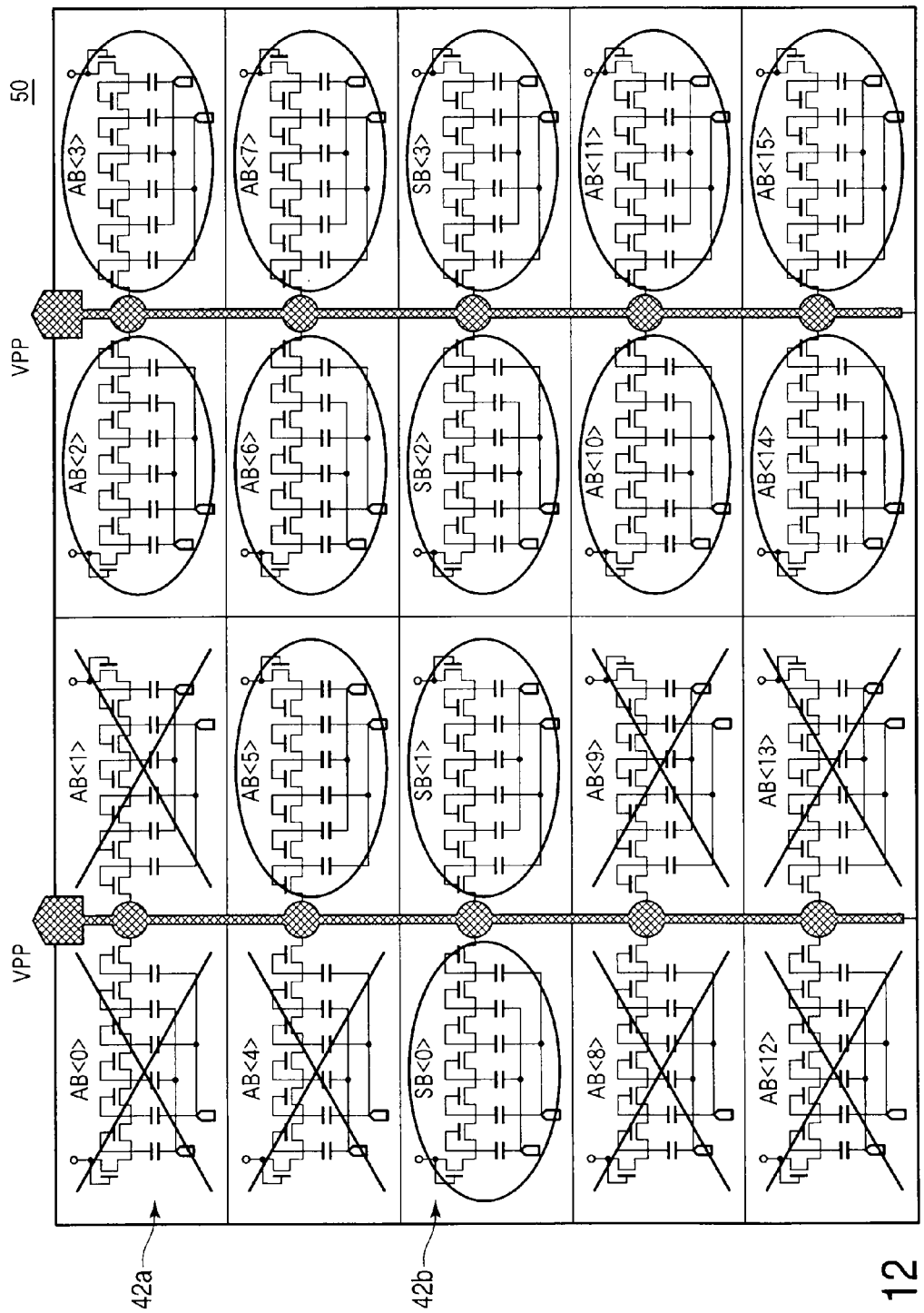
FIG. 12 is a circuit diagram showing the operation of charge pumps of a semiconductor memory device according to the fourth embodiment.

FIG. 12 is a circuit diagram of activation charge pumps 42a and standby charge pumps 42b arranged below a cell array portion A in each area 50.

In each area 50 of this embodiment as shown in FIG. 12, the activation charge pumps 42a are formed in blocks 70 at AB<0> to AB<15>, and the standby charge pumps 42b are formed in blocks 70 at SB<0> to SB<3>. The activation charge pump 42a is driven in an active state (in a write or read operation in which a chip enable signal is input). The standby charge pump 42b is driven in the active state and in a standby state (in a standby state of a write or read operation in which no chip enable signal is input).

Assume that selected NAND string bundles 20' exist in the blocks 70 at AB<0>, AB<4>, AB<8>, AB<9>, AB<12>, AB<13>, SB<0>, and SB<1>, as shown in FIG. 7.

In the active state, the activation charge pumps 42a arranged below the blocks 70 at AB<0>, AB<4>, AB<8>, AB<9>, AB<12>, and AB<13> are not driven, and the activation charge pumps 42a arranged below other blocks 70 are driven. On the other hand, the standby charge pumps 42b arranged below the blocks 70 at SB<0> to SB<3> are driven.

In the standby state, the activation charge pumps 42a arranged below the blocks 70 at AB<0> to AB<15> are not driven. On the other hand, the standby charge pumps 42b arranged below the blocks 70 at SB<0> to SB<3> are driven.

That is, all the standby charge pumps 42b arranged below the blocks 70 at SB<0> to SB<3> are always driven. This is so because the frequency of the standby charge pump 42b is lower than that of the activation charge pump 42a. Therefore, even when the selected NAND string bundles 20' exist in the blocks 70 at SB<0> to SB<3> and the standby charge pumps 42b arranged below these blocks are driven, a noise leak to the cell array portion A is small.

<Effects>

The fourth embodiment described above can achieve the same effects as those of the second embodiment.

In addition, in this embodiment, all the standby charge pumps 42b arranged below the blocks 70 at SB<0> to SB<3> are always driven regardless of the presence/absence of the selected NAND string bundle 20'. That is, all the standby charge pumps 42b are driven in the active state and standby state. This makes it possible to reduce the potential fluctuation when the active state changes to the standby state or vice versa. Accordingly, the operation speed in the active state can be increased.

Fifth Embodiment

A semiconductor memory device control method according to the fifth embodiment will be explained below with reference to FIG. 13. The fifth embodiment is an example in which the fourth embodiment is applied to the third embodiment. Note that in the fifth embodiment, an explanation of the same features as those of the above-mentioned embodiments will be omitted, and different features will be explained.

Figure 13:
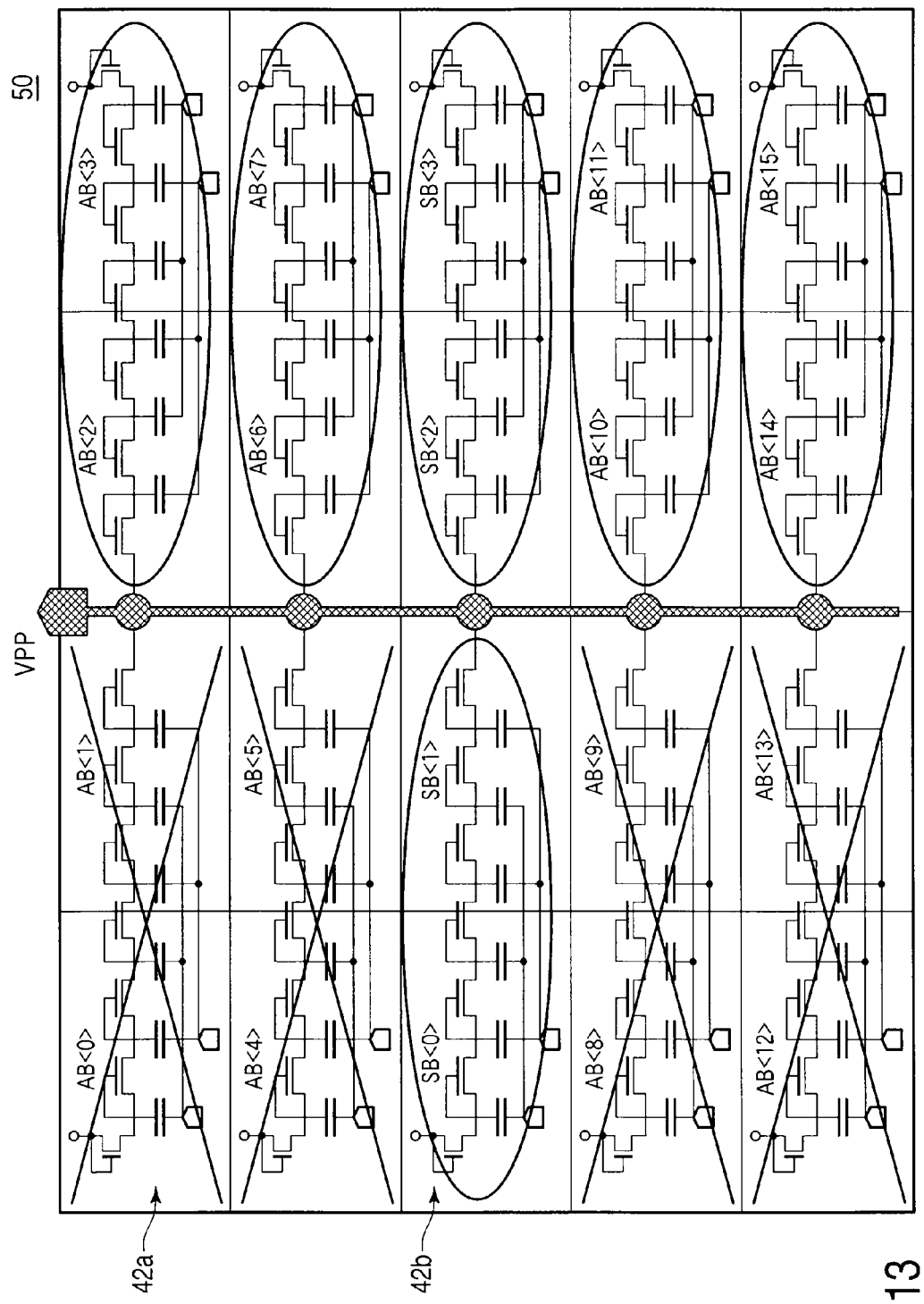
FIG. 13 is a circuit diagram showing the operation of charge pumps of a semiconductor memory device according to the fifth embodiment.

FIG. 13 is a circuit diagram of activation charge pumps 42a and standby charge pumps 42b arranged below a cell array portion A in one area 50.

In this embodiment as shown in FIG. 13, one charge pump 42 is formed below two adjacent blocks 70. More specifically, one activation charge pump 42a is formed for each pair of adjacent blocks 70 at AB<0> and AB<1> to adjacent blocks 70 at AB<14> and AB<15>, and one standby charge pump 42b is formed for each pair of adjacent blocks 70 at SB<0> and SB<1> and adjacent blocks 70 at SB<2> and SB<3>. The activation charge pumps 42a are driven in an active state. The standby charge pumps 42b are driven in the active state and in a standby state.

Assume that selected NAND string bundles 20' exist in the blocks 70 at AB<0>, AB<4>, AB<8>, AB<9>, AB<12>, AB<13>, SB<0>, and SB<1>, as shown in FIG. 7.

In the active state, the activation charge pumps 42a arranged below the blocks 70 at AB<0>, AB<4>, AB<8>, AB<9>, AB<12>, and AB<13> are not driven, and the activation charge pumps 42a arranged below other blocks 70 are driven. If the NAND string bundle 20' exists in one of the two blocks 70 for which one activation charge pump 42a is formed, the activation charge pump 42a is not driven. On the other hand, the standby charge pumps 42b arranged below the blocks 70 at SB<0> to SB<3> are driven.

In the standby state, the activation charge pumps 42a arranged below the blocks 70 at AB<0> to AB<15> are not driven. On the other hand, the standby charge pumps 42b arranged below the blocks 70 at SB<0> to SB<3> are driven.

That is, all the standby charge pumps 42b arranged below the blocks 70 at SB<0> to SB<3> are always driven.

<Effects>

The above-mentioned fifth embodiment can achieve the same effects as those of the third and fourth embodiments.

Sixth Embodiment

A semiconductor memory device control method according to the sixth embodiment will be explained below with reference to FIGS. 14A and 14B. The sixth embodiment is an example in which a voltage is supplied via charge pumps by driving ring oscillators arranged below a cell array portion A in which neither a write operation nor a read operation is performed, without driving ring oscillators arranged below a cell array portion A in which a write or read operation is performed. Note that in the sixth embodiment, an explanation of the same features as those of the above-mentioned embodiments will be omitted, and different features will be explained.

Figure 14A:
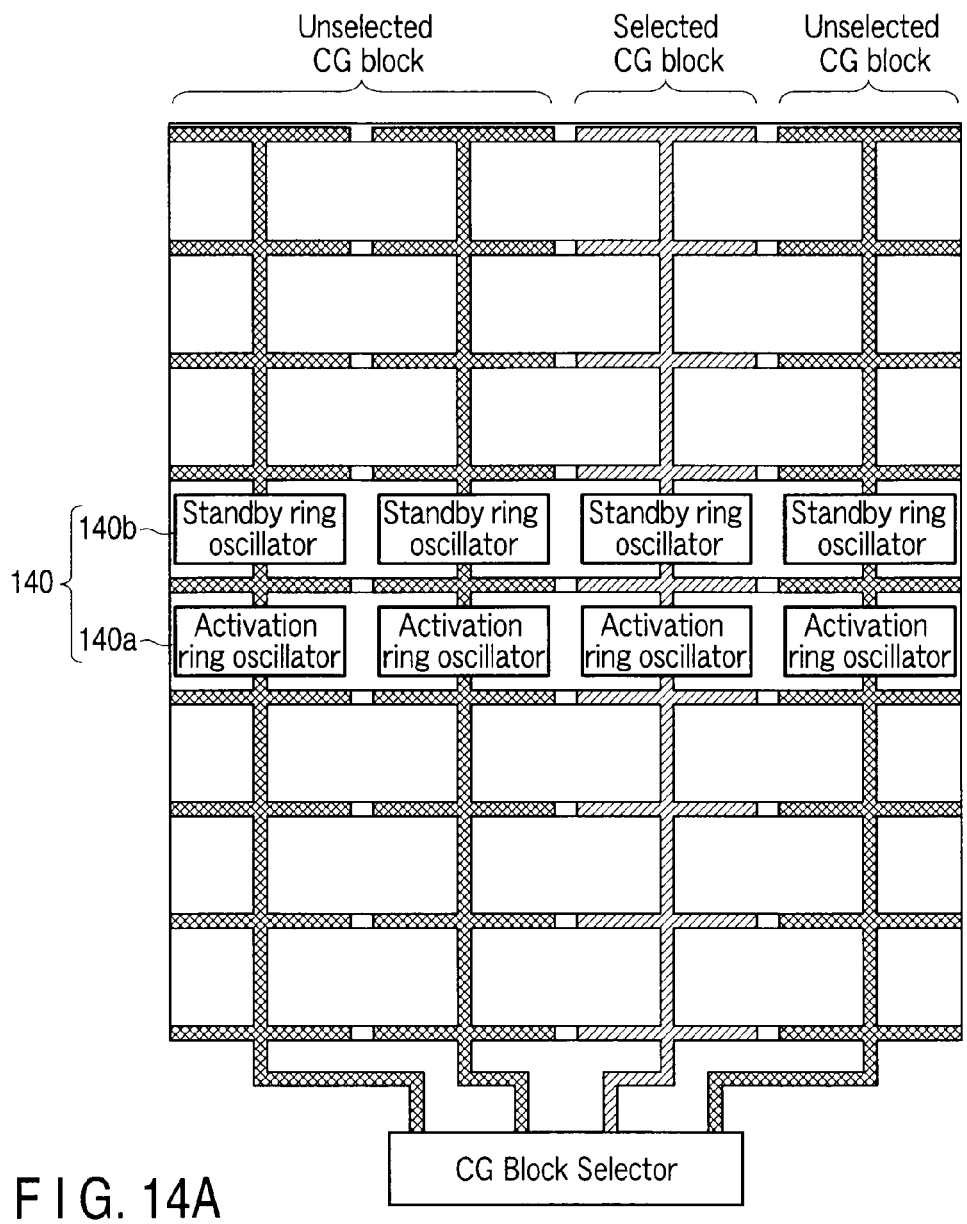
FIG. 14A is a plan view schematically showing the operation of ring oscillators of a semiconductor memory device according to the sixth embodiment.

FIG. 14A is a schematic plan view of the cell array portion A in each chip of a BiCS memory according to the sixth embodiment.

As shown in FIG. 14A, a ring oscillator 140 of this embodiment is formed in each CG block. More specifically, an activation ring oscillator 140a and standby ring oscillator 140b are formed below each CG block. Note that although not shown, charge pumps 42 are formed blow each CG block.

Figure 14B:
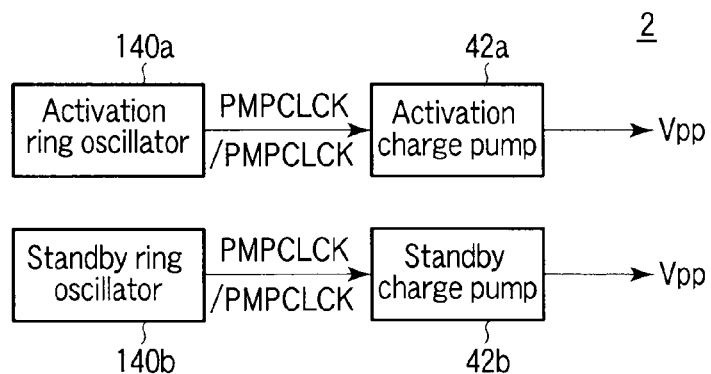
FIG. 14B is a block diagram showing the operation of a voltage generation circuit of the semiconductor memory device according to the sixth embodiment.

FIG. 14B shows an operation example of a voltage generation circuit 2 according to the sixth embodiment.

As shown in FIG. 14B, the voltage generation circuit 2 includes an activation charge pump 42a, the activation ring oscillator 140a, a standby charge pump 42b, and the standby ring oscillator 140b.

In an active state, the activation ring oscillator 140a outputs pump clock signals PMPCLCK and /PMPCLCK to the activation charge pump 42a. In accordance with the pump clock signals PMPCLCK and /PMPCLCK, the activation charge pump 42a outputs a voltage VPP boosted from a power supply voltage VDD.

In the active state and in a standby state, the standby ring oscillator 140b outputs the pump clock signals PMPCLCK and /PMPCLCK to the standby charge pump 42b. In accordance with the pump clock signals PMPCLCK and /PMPCLCK, the standby charge pump 42b outputs the voltage VPP boosted from the power supply voltage VDD.

In this embodiment, the activation ring oscillator 140a and standby ring oscillator 140b arranged below a selected CG block are driven, and at least one of the activation ring oscillator 140a and standby ring oscillator 140b arranged below an unselected CG block is driven. Consequently, the VPP potential is supplied to the selected CG block via the charge pumps 42.

<Effects>

The sixth embodiment described above can achieve the same effects as those of the first embodiment.

In addition, in this embodiment, not only the charge pumps 42 but also the ring oscillators 140 are formed below the cell array portion A. That is, since the ring oscillators 140 are formed within the range of the projected area of the cell array portion A, the total area of the chip can be reduced.

Also, the control method of this embodiment drives neither the charge pumps 42 nor the ring oscillators 140 arranged below a selected CG block. This is so because the ring oscillator 140 may give noise to the cell array portion A when oscillating, although the noise is not so large as that of the charge pump 42. That is, noise can further be reduced because the ring oscillators 140 arranged below a selected CG block are not driven.

Seventh Embodiment

A semiconductor memory device control method according to the seventh embodiment will be explained below with reference to FIG. 15. The seventh embodiment is an example in which ring oscillators are arranged not below a cell array portion A but in its periphery. Note that in the seventh embodiment, an explanation of the same features as those of the above-mentioned embodiments will be omitted, and different features will be explained.

FIG. 15 is a schematic plan view of the cell array portion A in each chip of a BiCS memory according to the seventh embodiment.

As shown in FIG. 15, a ring oscillator 140 (including an activation ring oscillator 140a and standby ring oscillator 140b) of this embodiment is formed in the periphery of the cell array portion A. Note that although not shown, charge pumps 42 are arranged below each CG block. It is also possible to form ring oscillators 140, instead of one ring oscillator 140, in the periphery of the cell array portion A.

<Effects>

The seventh embodiment described above can achieve the same effects as those of the first embodiment.

In addition, in this embodiment, the ring oscillator 140 is formed in the periphery of a selected CG block. This makes it possible to further reduce noise generated by the ring oscillator 140 if it is formed below a selected CG block. That is, if the ring oscillator 140 is formed below a selected CG block, a signal line (VPP line) and the cell array may produce a coupling capacitance. This may make the oscillation frequency lower than a desired value, so a desired potential may not be output.

Note that each embodiment described above has been explained by using NMOS Dickson charge pumps, but the embodiment is not limited to this. That is, PMOS charge pumps can be used instead of NMOS charge pumps. It is also possible to use doubler charge pumps or charge pumps of any type, instead of Dickson charge pumps.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a cell array comprising memory cell strings arranged in a matrix;

voltage generation circuits which are arranged below the cell array, and apply a voltage to the cell array; and a control circuit which controls the voltage generation circuits, each of the memory cell strings comprising:

a semiconductor layer comprising a pair of pillar portions extending in a direction perpendicular to a substrate and juxtaposed in a column direction, and a connecting portion formed to connect lower ends of the pair of pillar portions;

control gates extending in a row direction to intersect the pillar portion, and stacked in the direction perpendicular to the substrate; and memory cell transistors formed at intersections of the pillar portion and the control gates, and connected in series in the direction perpendicular to the substrate, wherein in a write operation and a read operation, the control circuit does not drive voltage generation circuits which give noise to memory cell strings as a write target and a read target, and drives voltage generation circuits which do not give noise to the memory cell strings as the write target and the read target.

2. The device of claim 1, wherein the voltage generation circuits which give noise to the memory cell strings as the write target and the read target are voltage generation circuits positioned below selected control gates, and the voltage generation circuits which do not give noise to the memory cell strings as the write target and the read target are voltage generation circuits positioned below unselected control gates.

3. The device of claim 1, wherein the cell array comprises blocks comprising a predetermined number of memory cell strings, the voltage generation circuits are formed below each block, the voltage generation circuits which give noise to the memory cell strings as the write target and the read target are voltage generation circuits positioned below blocks in which the memory cell strings as the write target and the read target exist, and the voltage generation circuits which do not give noise to the memory cell strings as the write target and the read target are voltage generation circuits positioned below a block in which the memory cell strings as the write target and the read target do not exist.

4. The device of claim 1, wherein the cell array comprises blocks comprising a predetermined number of memory cell strings, the voltage generation circuits are formed below every blocks, the voltage generation circuits which give noise to the memory cell strings as the write target and the read target are voltage generation circuits positioned below a block in which the memory cell strings as the write target and the read target exist, and the voltage generation circuits which do not give noise to the memory cell strings as the write target and the read target are voltage generation circuits positioned below a block in which the memory cell strings as the write target and the read target do not exist.

5. The device of claim 1, wherein the voltage generation circuits comprise a charge pump circuits formed below the cell array.

6. The device of claim 5, wherein the charge pump circuits comprise activation charge pump circuits which operate in an active state, and standby charge pump circuits which operate in a standby state.

7. The device of claim 6, wherein the standby charge pump circuits are the voltage generation circuits which does not give noise to the memory cell strings as the write target and the read target.

8. The device of claim 7, wherein the standby charge pump circuits operate in the active state as well.

9. The device of claim 1, wherein the voltage generation circuits comprise:

charge pump circuits formed below the cell array; and ring oscillators which are formed below the cell array, and drive the charge pump circuits.

10. The device of claim 1, wherein the voltage generation circuits comprise:

charge pump circuits formed below the cell array; and ring oscillators which are formed in a periphery of the cell array, and drive the charge pump circuits.

* * * * *